(12) United States Patent
Kim

(10) Patent No.: US 10,847,591 B1
(45) Date of Patent: Nov. 24, 2020

(54) DISPLAY PANEL AND MANUFACTURING METHOD THEREOF

(71) Applicant: Samsung Display Co., Ltd., Yongin-Si (KR)

(72) Inventor: Geuntak Kim, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/782,929

(22) Filed: Feb. 5, 2020

(30) Foreign Application Priority Data

May 21, 2019 (KR) .......................... 10-2019-0059463

(51) Int. Cl.
*H01L 27/32* (2006.01)
(52) U.S. Cl.
CPC ...... *H01L 27/3246* (2013.01); *H01L 27/3276* (2013.01)
(58) Field of Classification Search
CPC ........................ H01L 27/3246; H01L 27/3276
See application file for complete search history.

(56) References Cited

U.S. PATENT DOCUMENTS

| | | | |
|---|---|---|---|
| 7,781,963 B2 | 8/2010 | Yoshida et al. | |
| 7,888,867 B2 | 2/2011 | Yoshida et al. | |
| 8,816,339 B2 | 8/2014 | Kawamura et al. | |
| 9,035,330 B2 | 5/2015 | Kang et al. | |
| 9,786,866 B2 | 10/2017 | Maeda | |
| 2019/0103419 A1* | 4/2019 | Wang | ................. H01L 27/1259 |

FOREIGN PATENT DOCUMENTS

| | | |
|---|---|---|
| JP | 4540747 B2 | 9/2010 |
| JP | 2013004188 A | 1/2013 |
| JP | 5677435 B2 | 2/2015 |
| KR | 10-1146991 B1 | 5/2012 |
| KR | 10-1862443 B1 | 7/2018 |

* cited by examiner

*Primary Examiner* — Andrew Q Tran
(74) *Attorney, Agent, or Firm* — Innovation Counsel LLP

(57) ABSTRACT

A display panel according to an embodiment of the inventive concept includes a base substrate on which a pixel area and a surrounding area adjacent to the pixel area are defined, a pixel defining layer which is disposed on the base substrate and on which a plurality of openings corresponding to the pixel area are defined, and a plurality of light emitting layers disposed in the plurality of openings, respectively. Here, the pixel defining layer includes a first pixel defining portion, a second pixel defining portion disposed between the light emitting layers and the first pixel defining portion, and a third pixel defining portion that covers the first pixel defining portion and the second pixel defining portion and includes a spaced portion that exposes a portion of the first pixel defining portion.

20 Claims, 15 Drawing Sheets

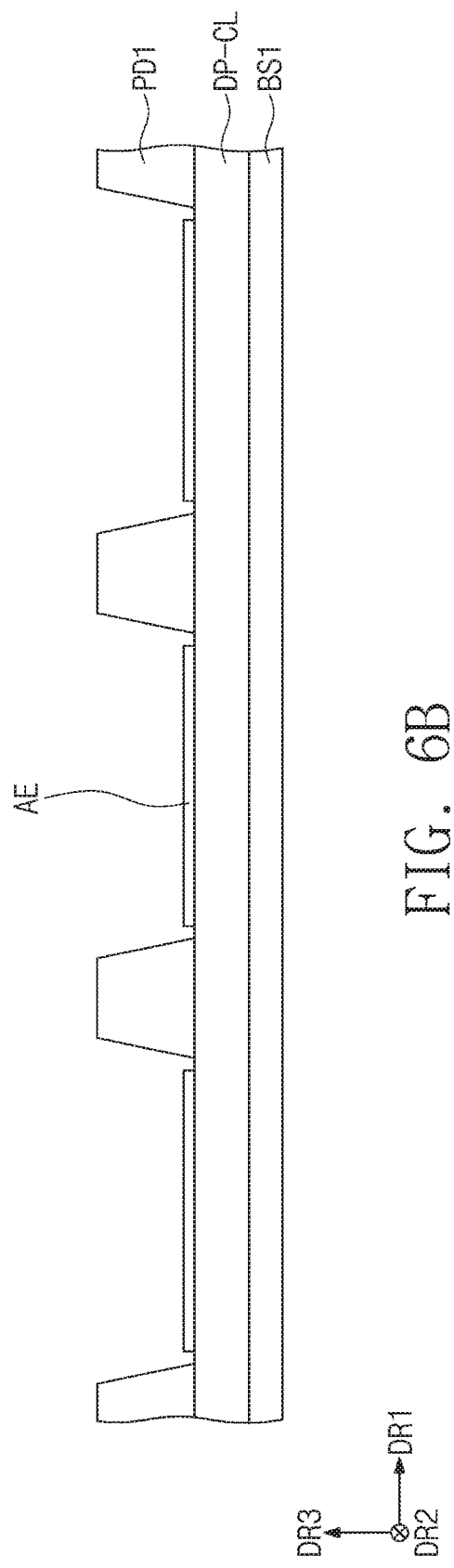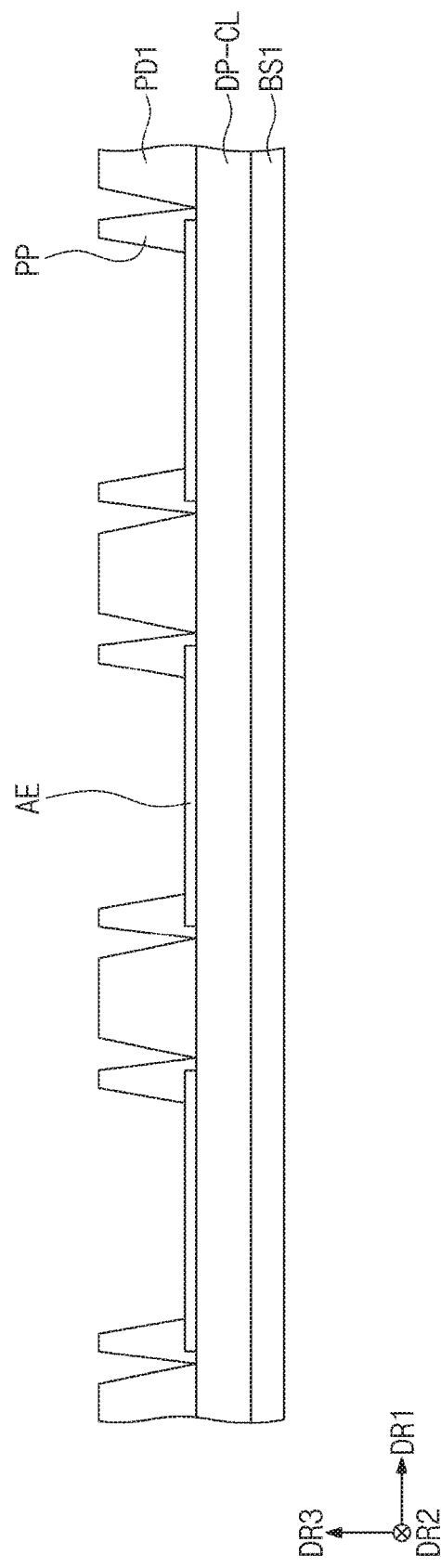

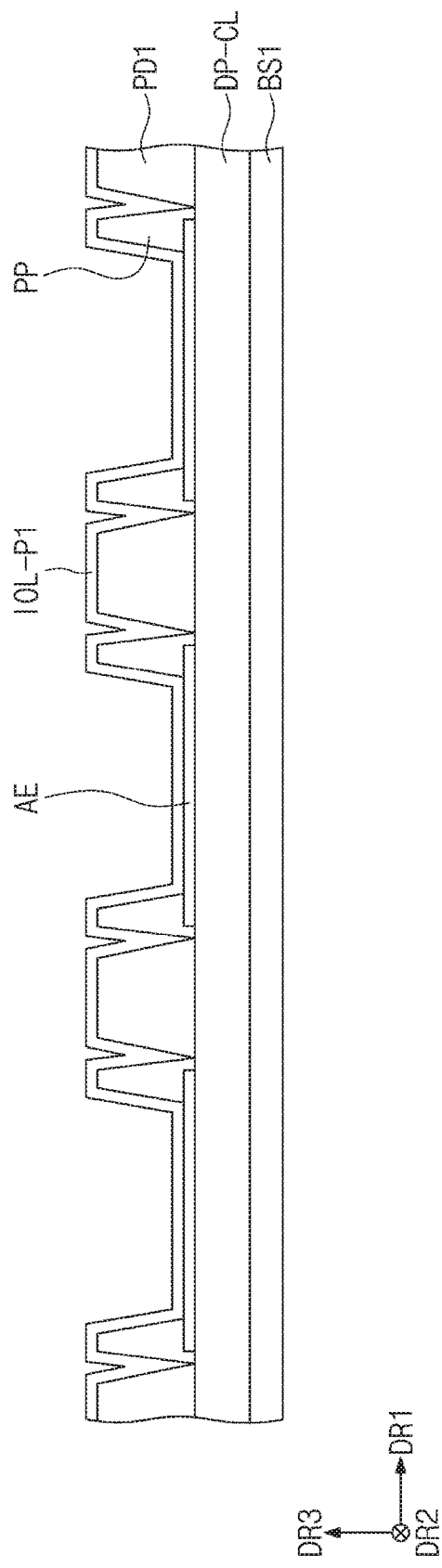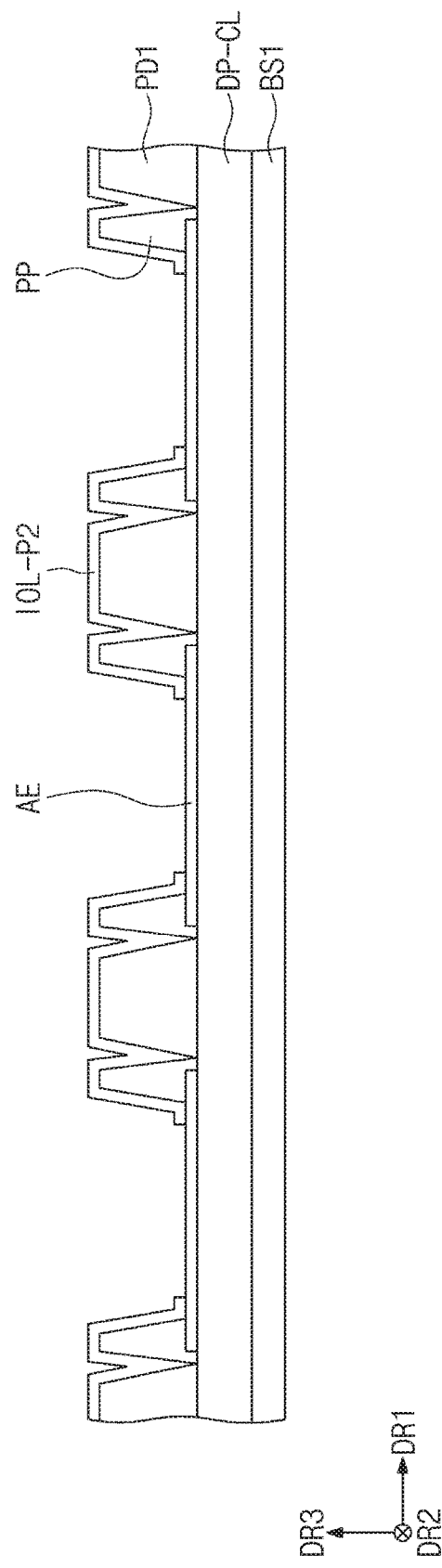

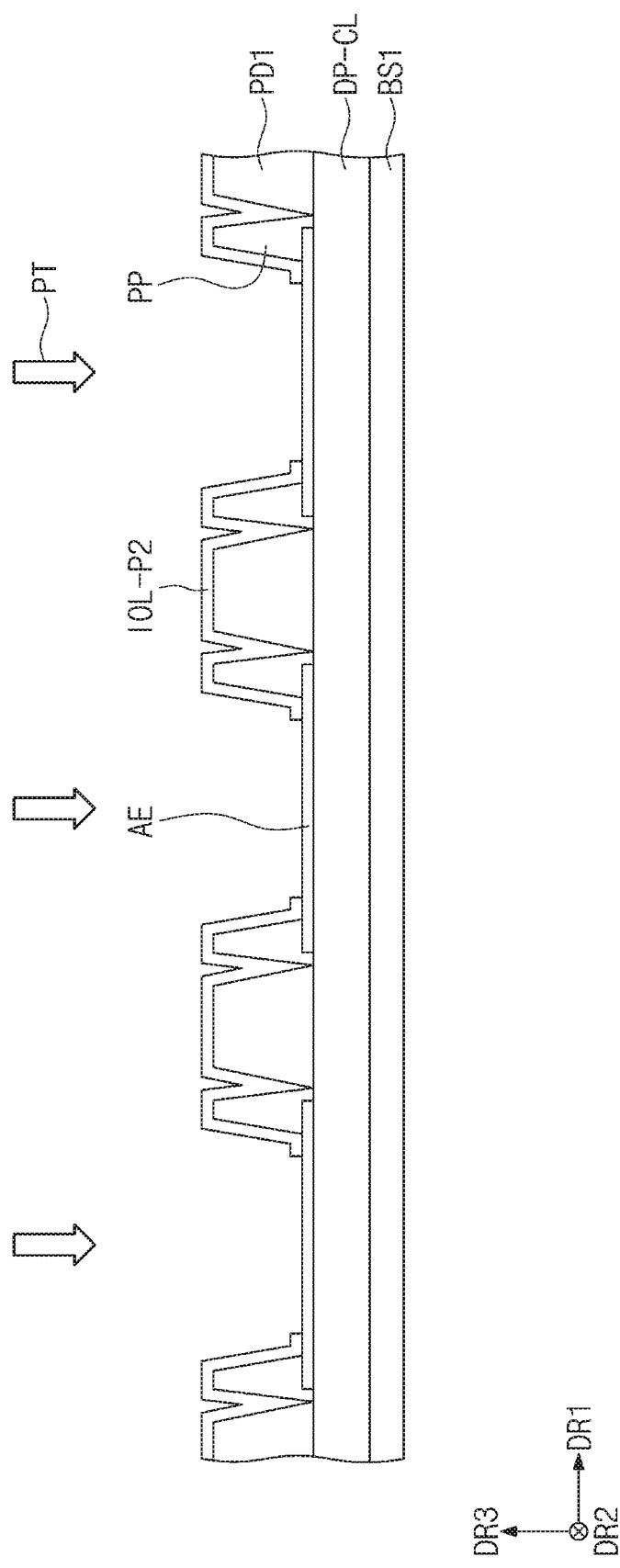

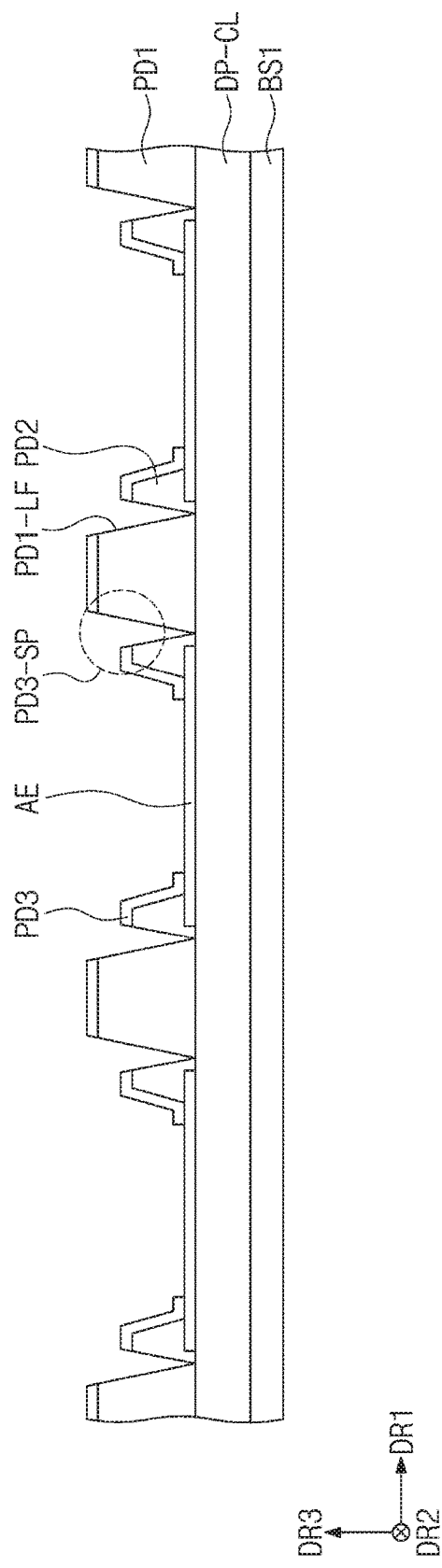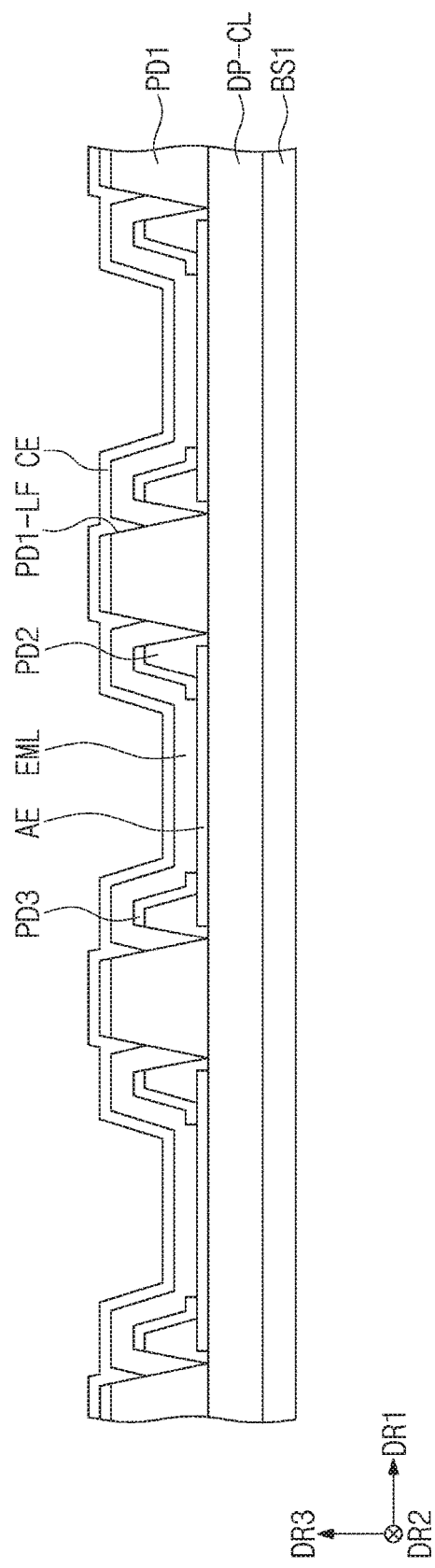

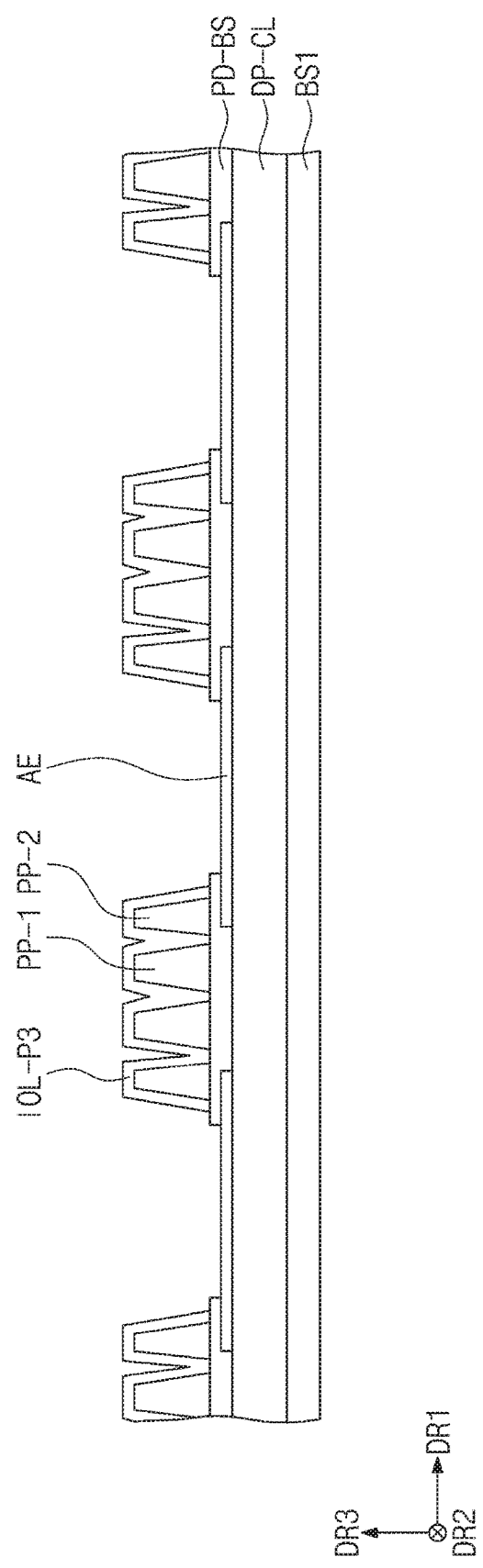
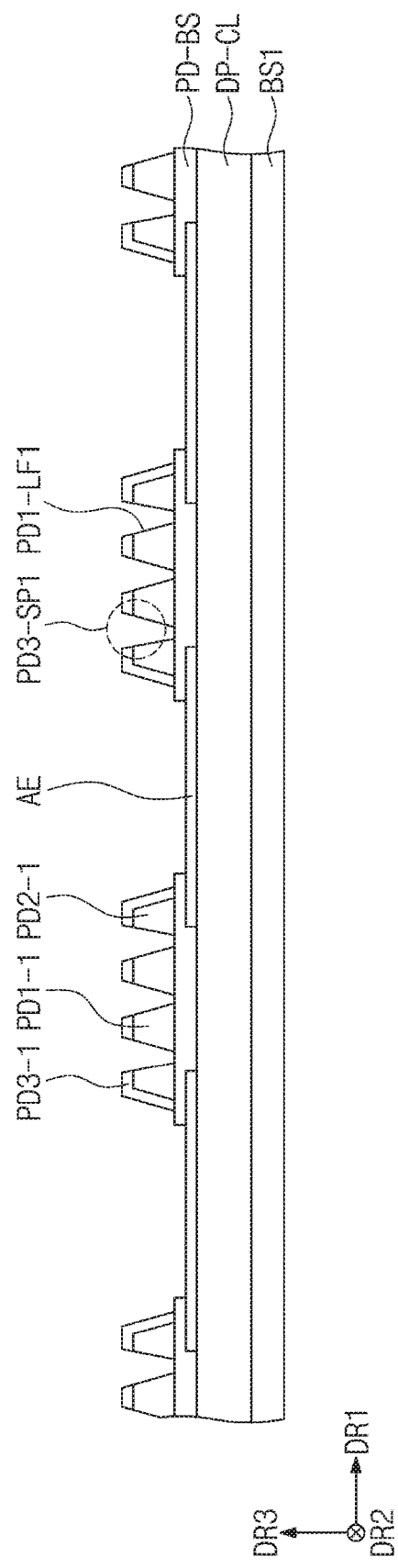

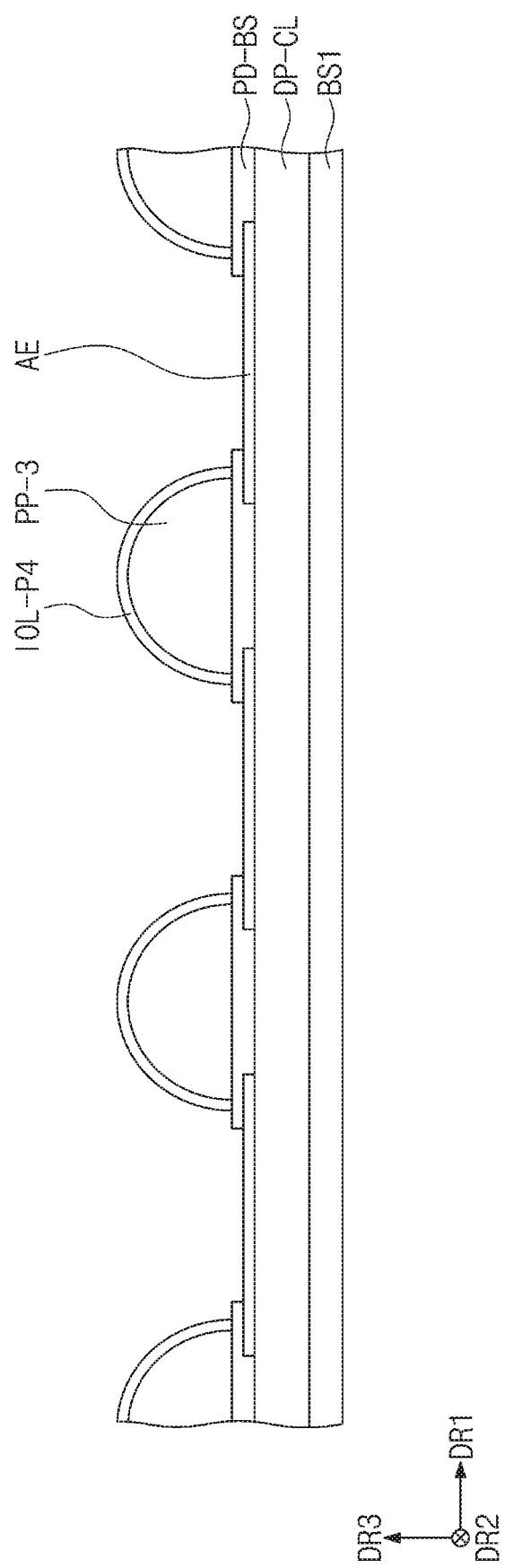

DISPLAY PANEL AND MANUFACTURING METHOD THEREOF

CROSS-REFERENCE TO RELATED APPLICATIONS

This U.S. non-provisional patent application claims priority under 35 U.S.C. § 119 to Korean Patent Application No. 10-2019-0059463, filed on May 21, 2019, the entire contents of which are hereby incorporated by reference.

BACKGROUND

The present disclosure herein relates to a display panel and a manufacturing method thereof. More particularly, the present disclosure herein relates to a display panel having improved light emitting characteristics and improved reliability and a manufacturing method thereof.

An electronic device is activated according to an electrical signal. The electronic device includes various electronic components such as an electronic panel and an electronic module. The electronic panel includes a plurality of light emitting elements that generate an image. The light emitting elements may define light emitting areas, respectively, and the image may be realized through light emitted by the light emitting elements in the light emitting areas.

In general, a plurality of anodes are disposed on a substrate, and an organic insulation layer is provided to cover the anodes. A pixel defining layer is provided by patterning the organic insulation layer to have a plurality of openings. Predetermined areas of the anode electrodes are exposed by the openings of the pixel defining layers, respectively. The areas provided by the openings may be defined as light emitting areas of the pixels.

Light emitting layers are provided on the anodes in the light emitting areas of the pixels. The light emitting layers may be provided by a printing method such as an inkjet printing.

SUMMARY

The present disclosure provides a display panel having an improved light emitting efficiency and improved reliability without decrease in liquid repellency of an organic pixel defining layer although a residue treatment process is contained and a manufacturing method thereof.

An embodiment of the inventive concept provides a display panel including: a base substrate on which a pixel area and a surrounding area adjacent to the pixel area are defined; a pixel defining layer which is disposed on the base substrate and on which a plurality of openings corresponding to the pixel area are defined; and a plurality of light emitting layers disposed in the plurality of openings, respectively. Here, the pixel defining layer includes: a first pixel defining portion; a second pixel defining portion disposed between the light emitting layers and the first pixel defining portion; and a third pixel defining portion covering the first pixel defining portion and the second pixel defining portion and including a spaced portion exposing a portion of the first pixel defining portion.

In an embodiment, the first pixel defining portion may include one side surface adjacent to the second pixel defining portion, and the one side surface may be exposed by the spaced portion of the third pixel defining portion.

In an embodiment, the first pixel defining portion may include a hydrophobic material.

In an embodiment, the light emitting layer may contact the exposed portion of the first pixel defining portion.

In an embodiment, the third pixel defining portion may overlap at least a portion of the light emitting layer in a plan view.

In an embodiment, the third pixel defining portion may include at least one of a silicon nitride ($SiN_x$), a silicon oxide ($SiO_x$), or a silicon oxynitride ($SiO_xN_y$).

In an embodiment, the display panel may further include a base pixel defining layer that overlaps the surrounding area of the base substrate. The pixel defining layer may be disposed on the base pixel defining layer.

In an embodiment, the first pixel defining portion may have a height equal to or greater than that of the second pixel defining portion.

In an embodiment, the first pixel defining portion and the second pixel defining portion may be spaced apart from each other.

In an embodiment, the first pixel defining portion may include a plurality of sub-patterns that are spaced apart from each other in a first direction.

In an embodiment of the inventive concept, a manufacturing method of a display panel includes: forming a plurality of electrodes on a base substrate; forming a plurality of organic patterns by patterning an organic material on the base substrate on the plurality of electrode; forming an inorganic layer to cover the plurality of organic patterns; patterning the inorganic layer to expose the plurality of electrodes; removing a residue on the plurality of electrodes; and curing the organic patterns to form a pixel defining layer.

In an embodiment, in the patterning the inorganic layer, a spaced portion may be formed in the inorganic layer.

In an embodiment, at least a portion of the cured organic patterns may be exposed by the spaced portion.

In an embodiment, a plurality of openings may be defined in the pixel defining layer to expose the plurality of electrodes. The manufacturing method may further include forming an intermediate layer including a light emitting material in each of the plurality of openings after the forming of the pixel defining layer. The intermediate layer may contact the exposed portion of the cured organic patterns.

In an embodiment, the pixel defining layer may include a first pixel defining portion, a second pixel defining portion spaced apart from the first pixel defining portion, and a third pixel defining portion covering the first pixel defining portion and the second pixel defining portion and in which a spaced portion exposing a portion of the first pixel defining portion is defined. The first pixel defining portion may be formed by curing first organic patterns formed on the base substrate before the forming of the inorganic layer. The second pixel defining portion may be formed by curing second organic patterns formed adjacent to the first pixel defining portion on the base substrate after the forming of the inorganic layer.

In an embodiment, before the curing of the second organic patterns, the third pixel defining portion may be formed by forming the spaced portion in the inorganic layer. The spaced portion may be formed at a boundary between the first pixel defining portion and the second pixel defining portion.

In an embodiment, in the forming of the pixel defining layer, the organic pattern may be contracted by the curing process.

In an embodiment, the plurality of organic patterns may include a hydrophobic material.

In an embodiment, the removing of the residue may include performing plasma treatment on a surface of the inorganic layer.

In an embodiment, the manufacturing method may further include forming a base pixel defining layer on the base substrate before the forming of the plurality of organic patterns. The pixel defining layer may be formed on the base pixel defining layer.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 6A, 6B, 6C, 6D, 6E, 6F and 6G are cross-sectional views sequentially illustrating partial processes of a manufacturing method of a display panel according to an embodiment of the inventive concept;

FIGS. 7A and 7B are cross-sectional views sequentially illustrating partial processes of a manufacturing method of a display panel according to an embodiment of the inventive concept; and FIGS. 8A and 8B are cross-sectional views sequentially illustrating partial processes of a manufacturing method of a display panel according to an embodiment of the inventive concept.

DETAILED DESCRIPTION

Figure 1:
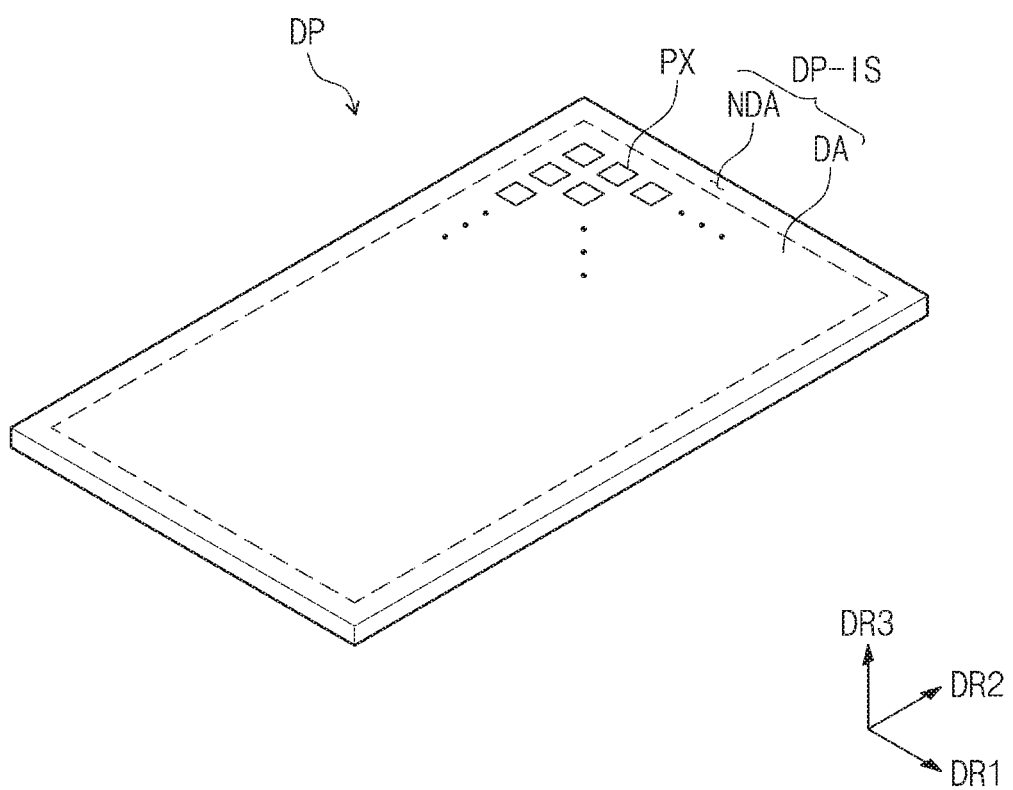
FIG. 1 is a perspective view illustrating a display panel according to an embodiment of the inventive concept.

Hereinafter, preferred embodiments of the present inventive concept will be described below in more detail with reference to the accompanying drawings. Since the present disclosure may have diverse modified embodiments, preferred embodiments are illustrated in the drawings and are described in the detailed description of the inventive concept. However, this does not limit the present disclosure within specific embodiments and it should be understood that the present disclosure covers all the modifications, equivalents, and replacements within the idea and technical scope of the inventive concept.

Like reference numerals refer to like elements throughout. In the drawings, the dimensions and size of each structure are exaggerated, omitted, or schematically illustrated for convenience in description and clarity. It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

The meaning of 'include' or 'comprise' specifies a property, a region, a fixed number, a step, a process, an element and/or a component but does not exclude other properties, regions, fixed numbers, steps, processes, elements and/or components.

In the specification, it will be understood that when a layer (or film), a region, or a plate is referred to as being 'on' another layer, region, or plate, it can be directly on the other layer, region, or plate, or intervening layers, regions, or plates may also be present. On the contrary to this, it will be understood that when a layer (or film), a region, or a plate is referred to as being 'under' another layer, region, or plate, it can be directly under the other layer (or film), region, or plate, or intervening layers, regions, or plates may also be present. Also, in this specification, a structure in which a layer, a film, a region, or a plate is disposed "on" another layer, film, region, or plate may include a structure in which the layer, film, region, or plate is disposed on a lower portion as well as an upper portion of another layer, film, region, or plate.

On the other hand, it will be understood that when a layer, a film, a region, or a plate is "directly disposed" on another layer, film, region, or plate, further another layer, film, region, or plate cannot be present therebetween. For example, a feature of "directly disposed" may represent that two layers or two members are disposed without using an additional member such as an adhesive member.

Hereinafter, a display panel according to an embodiment of the inventive concept will be described with reference to the accompanying drawings.

Since the present disclosure may have diverse modified embodiments, preferred embodiments are illustrated in the drawings and are described in the detailed description of the inventive concept. However, this does not limit the present disclosure within specific embodiments and it should be understood that the present disclosure covers all the modifications, equivalents, and replacements within the idea and technical scope of the inventive concept.

Like reference numerals refer to like elements throughout. In the figures, the dimensions of layers and regions are exaggerated for clarity of illustration. It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

The meaning of "include," "comprise," "including," or "comprising," specifies features, integers, steps, operations, elements, components or combinations thereof listed in the specification but does not exclude other features, integers, steps, operations, elements, components or combinations thereof.

Figure 2:
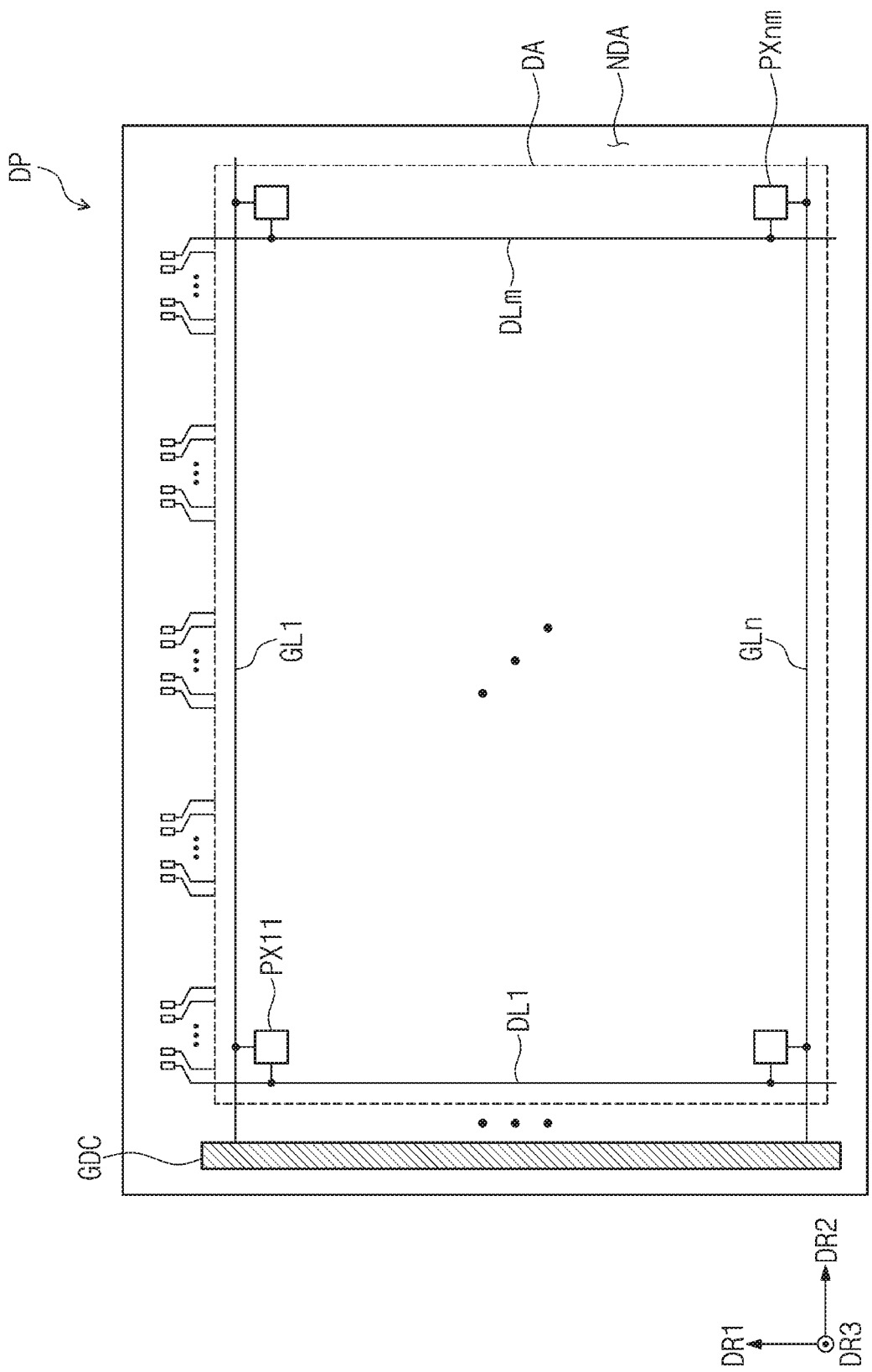
FIG. 2 is a plan view illustrating the display panel according to an embodiment of the inventive concept.

FIG. 1 is a perspective view illustrating a display panel DP according to an embodiment of the inventive concept. FIG. 2 is a plan view illustrating the display panel DP according to an embodiment of the inventive concept.

Referring to FIGS. 1 and 2, the display panel DP may be one of a liquid crystal display panel, an electrophoretic display panel, a microelectromechanical system display panel, an electrowetting display panel, an organic light emitting display panel, a micro LED display panel, a quantum dot display panel, and a quantum rod display panel. However, the embodiment of the inventive concept is not particularly limited thereto.

Although not separately shown, the display panel DP may further include a chassis member or a molding member, and may further include a backlight unit according to a kind of the display panel DP.

As illustrated in FIG. 1, the display panel DP may display an image through a display surface DP-IS. The display surface DP-IS is parallel to a plane defined by a first direction DR1 and a second direction DR2. The display surface DP-IS may include a display area DA and a non-display area NDA. A pixel PX is disposed on the display area DA. The non-display area NDA is defined along an edge of the display surface DP-IS. The display area DA may be surrounded by the non-display area NDA.

A normal direction of the display surface DP-IS, i.e., a thickness direction of the display panel DP, indicates a third direction DR3. Hereinafter, a front surface (or top surface) and a rear surface (or bottom surface) of each of layers or units are distinguished by the third direction DR3. However, the first to third directions DR1, DR2, and DR3 are intended to be illustrative in the embodiment. Hereinafter, first to third directions are defined as directions indicated by the first to third directions DR1, DR2, and DR3 and designated by the same reference symbols, respectively.

Although the display panel DP having a flat display surface DP-IS is illustrated in an embodiment of the inventive concept, the embodiment of the inventive concept is not limited thereto. For example, the display panel DP may include a curved display surface or a three-dimensional display surface. The three-dimensional display surface may include a plurality of display areas having light emitting directions different from each other.

In FIG. 2, a planar arrangement relationship between signal lines GL1 to GLn and DL1 to DLm and pixels PX11 to PXnm is illustrated. The signal lines may include a plurality of gate lines GL1 to GLn and a plurality of data lines DL1 to DLm.

Each of the pixels PX11 to PXnm is connected to a corresponding gate line of the plurality of gate lines GL1 to GLn and a corresponding data line of the plurality of data lines DL1 to DLm. Each of the pixels PX11 to PXnm may include a pixel driving circuit and a display element. More signal lines may be provided on the display panel DP according to a configuration of the pixel driving circuit.

Although the pixels PX11 to PXnm may be arranged in a matrix form, the embodiment of the inventive concept is not limited thereto. For example, the pixels PX11 to PXnm may be arranged in a PenTile matrix form. Alternatively, the pixels PX11 to PXnm may be arranged in a diamond form.

A gate driving circuit GDC may be disposed on the non-display area NDA. The gate driving circuit GDC may be integrated in the display panel DP through an oxide silicon gate driver circuit (OSG) or amorphous silicon gate driver circuit (ASG) process.

Figure 3A:
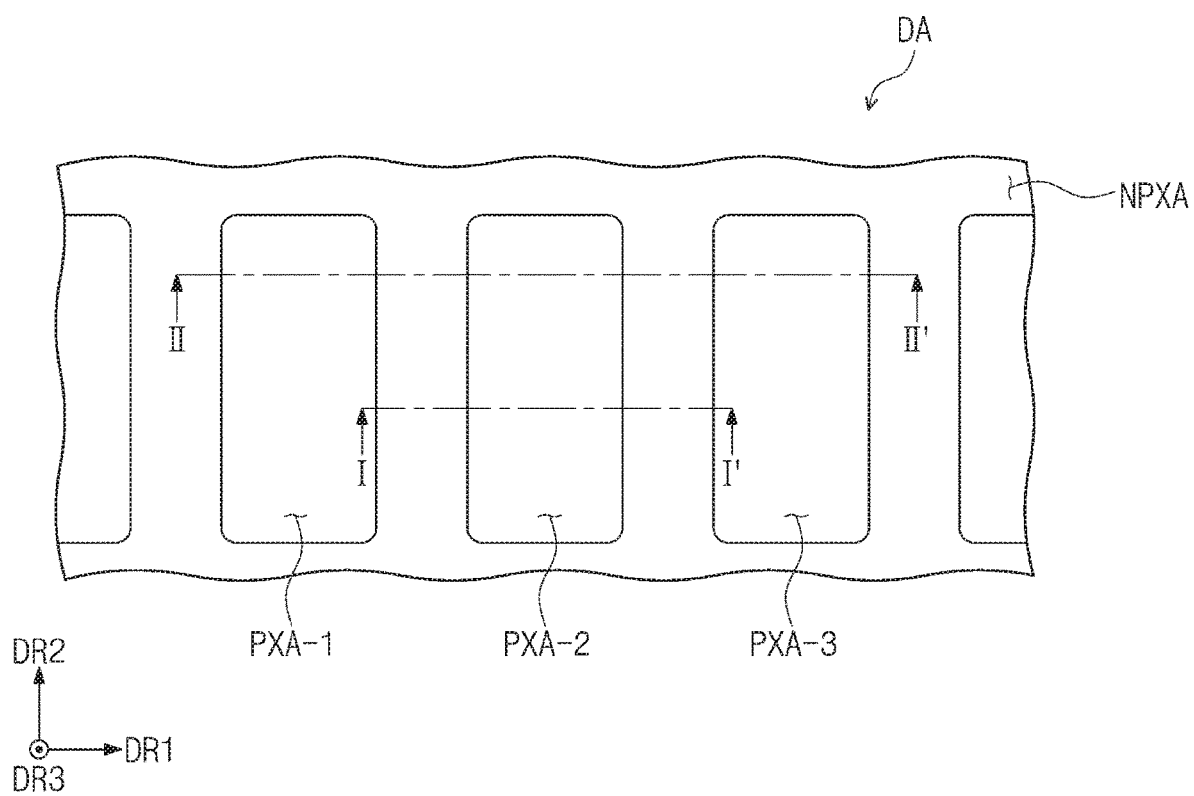
FIG. 3A is a plan view illustrating pixel areas of the display panel according to an embodiment of the inventive concept.
Figure 3B:
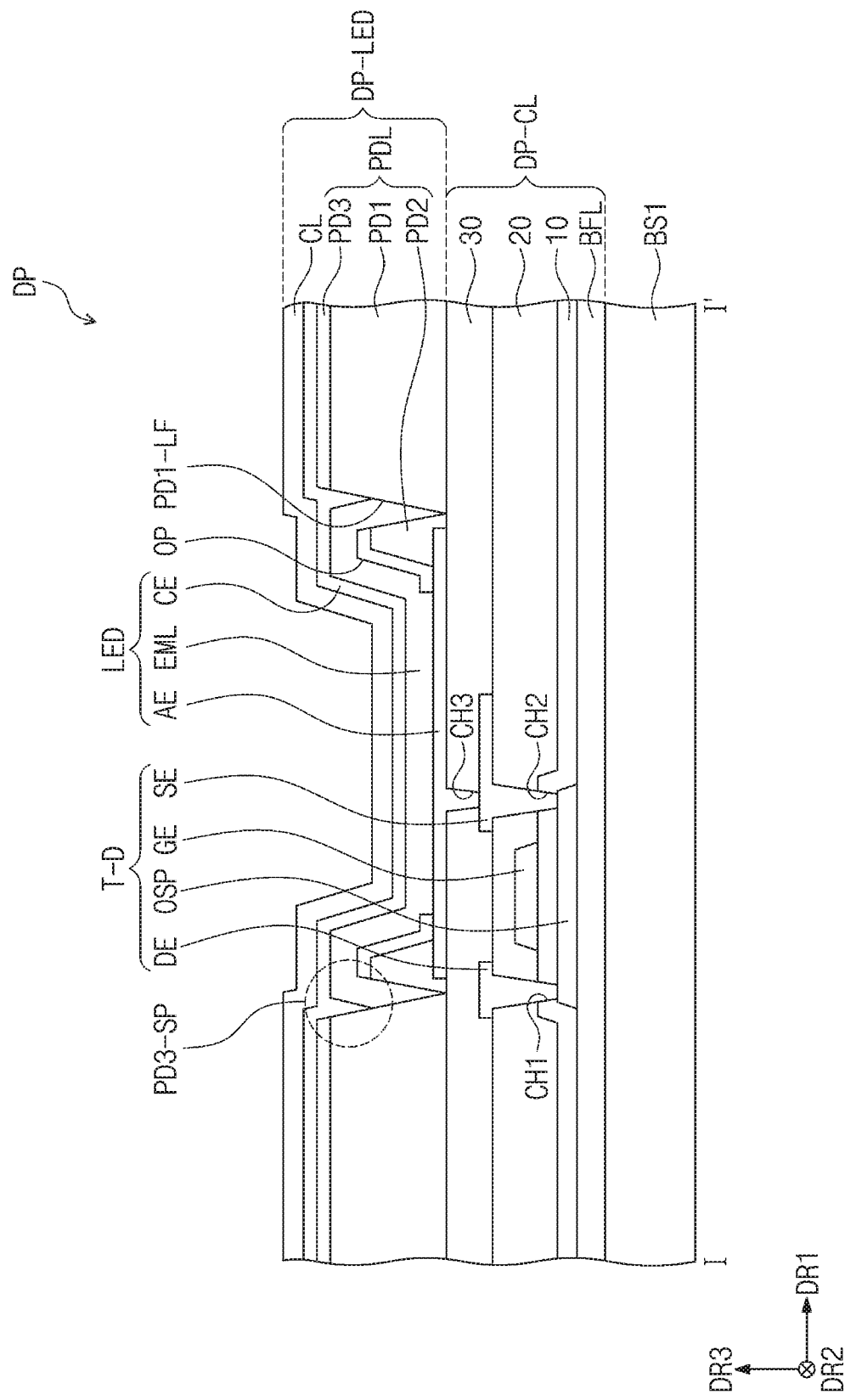
FIG. 3B is a cross-sectional view illustrating the pixel area of the display panel according to an embodiment of the inventive concept.

FIG. 3A is a plan view illustrating pixel areas PXA-1, PXA-2, and PXA-3 of the display panel DP according to an embodiment of the inventive concept. FIG. 3B is a cross-sectional view illustrating the pixel area PXA-2 of the display panel DP according to an embodiment of the inventive concept. FIG. 3B is a cross-sectional view taken long line I-I' of FIG. 3A.

FIG. 3A is an enlarged view illustrating a portion of the display area DA in FIG. 1. In FIG. 3A, three kinds of pixel areas PXA-1, PXA-2, and PXA-3 are mainly illustrated. The three kinds of pixel areas PXA-1, PXA-2, and PXA-3 in FIG. 3A may be arranged in a repeated manner over the entire display area DA.

Referring to FIG. 3A, a surrounding area NPXA is disposed around the pixel areas PXA-1, PXA-2, and PXA-3. The surrounding area NPXA is disposed in a boundary between the pixel areas PXA-1, PXA-2, and PXA-3 to prevent color mixture between the pixel areas PXA-1, PXA-2, and PXA-3. Also, the surrounding area NPXA blocks source light so that the source light is not emitted through the surrounding area NPXA, thus the light incident on the surrounding area NPXA is not provided to a user.

Although the first to third pixel areas PXA-1, PXA-2, and PXA-3 have the same planar area as each other in the embodiment, the embodiment of the inventive concept is not limited thereto. For example, the first to third pixel areas PXA-1, PXA-2, and PXA-3 may have different areas from each other, or at least two of the first to third pixel areas may have different areas from each other. Also, although each of the first to third pixel areas PXA-1, PXA-2, and PXA-3 has a rectangular shape having rounded corners in a plan view, the embodiment of the inventive concept is not limited thereto. For example, in the plan view, each of the first to third pixel areas PXA-1, PXA-2, and PXA-3 may have polygonal shape, and the corner may have a rounded polygon shape.

One of the first to third pixel areas PXA-1, PXA-2, and PXA-3 may provide first color light to the user, another may provide second color light that is different from the first color light, and the rest may provide third color light that is different from the first color light and the second color light. In an embodiment, the first pixel area PXA-1 may provide red light, the second pixel area PXA-2 may provide green light, and the third pixel area PXA-3 may provide blue light. In the embodiment, the source light may be the blue light that is the third color light. The source light may be generated from a light source such as a backlight unit or from a display element such as a light emitting diode.

FIG. 3B illustrates a cross-section of the display panel DP corresponding to the second pixel area PXA-2. FIG. 3B exemplarily illustrates a cross-section corresponding to a driving transistor and a light emitting element LED.

As illustrated in FIG. 3B, the display panel DP may include a first base substrate BS1, a circuit element layer DP-CL disposed on the first base substrate BS1, and a display element layer DP-LED disposed on the circuit element layer DP-CL.

The first base substrate BS1 may include a synthetic resin substrate or a glass substrate. The circuit element layer DP-CL includes at least one insulation layer and a circuit element. The circuit element includes a signal line and a driving circuit of a pixel. The circuit element layer DP-CL may be provided through a process of forming an insulation layer, a semiconductor layer, and a conductive layer by, e.g., a coating or deposition process and a process of patterning the insulation layer, the semiconductor layer, and the conductive layer by a photolithography process.

In the embodiment, the circuit element layer DP-CL may include a buffer layer BFL, a first insulation layer 10, a second insulation layer 20, and a third insulation layer 30. Each of the first insulation 10 and the second insulation layer 20 may be an inorganic layer, and the third insulation layer 30 may be an organic layer. The third insulation layer 30 may contain polyimide (PI).

In FIGS. 3A and 3B, an arrangement relationship between a semiconductor pattern OSP, a control electrode GE, an input electrode DE, and an output electrode SE of a driving transistor is exemplarily illustrated. Also, first to third through-holes CH1, CH2, and CH3 are exemplarily illustrated.

The display element layer DP-LED includes the light emitting element LED. The light emitting element may generate the above-described source light. The light emitting element LED includes a first electrode, a second electrode, and a light emitting layer disposed therebetween. In the embodiment, the light emitting element LED may include an organic light emitting diode. However, the embodiment of the inventive concept is not limited thereto. As a non-limited example, the light emitting element LED contained in the display element layer DP-LED may include various display elements such as LCD, LED, a micro-LED, a nano-LED, a quantum dot, or a quantum rod. The display element layer DP-LED includes a pixel defining layer PDL.

An opening OP corresponding to the second pixel area PXA-2 is defined in the pixel defining layer PDL. Although not illustrated in FIG. 3B, a plurality of openings corresponding to the first to third pixel areas PXA-1, PXA-2, and PXA-3, respectively, may be defined in the pixel defining layer PDL.

The pixel defining layer PDL may include a first pixel defining portion PD1, a second pixel defining portion PD2, and a third pixel defining portion PD3. The first pixel defining portion PD1 may be disposed to surround the second pixel area PXA-2 on the surrounding area NPXA, and the second pixel defining portion PD2 may be disposed on an outer portion of the surrounding area NPXA. The second pixel defining portion PD2 may be disposed more adjacent to the second pixel area PXA-2 than the first pixel defining portion PD1. The second pixel defining portion PD2 is disposed between the second pixel area PXA-2 and the first pixel defining portion PD1 to surround the second pixel area PXA-2. The first pixel defining portion PD1 and the second pixel defining portion PD2 may be spaced apart from each other in the first direction DR1 and the second direction DR2, and the first pixel defining portion PD2 may have a mesh shape disposed over the entire display area DA. In FIG. 3B, although the first pixel defining portion PD1 exemplarily has a height greater than that of the second pixel defining portion PD2 in a length of the third direction DR3 of the first pixel defining portion PD1, i.e., the cross-section, the embodiment of the inventive concept is not limited thereto. For example, the first pixel defining portion PD1 may have the same height as that of the second pixel defining portion PD2.

The third pixel defining portion PD3 is disposed on the first pixel defining portion PD1 and the second pixel defining portion PD2 to cover the first pixel defining portion PD1 and the second pixel defining portion PD2. At least one spaced portion PD3-SP is defined in the third pixel defining portion PD3. At least a portion of the first pixel defining portion PD1 may be exposed by the spaced portion PD3-SP of the third pixel defining portion PD3.

In an embodiment, the first pixel defining portion PD1 may include one side surface PD1-LF adjacent to the second pixel defining portion PD2. The spaced portion PD3-SP of the third pixel defining portion PD3 may be defined between the first pixel defining portion PD1 and the second pixel defining portion PD2 to expose the one side surface PD1-LF of the first pixel defining portion PD1.

Each of the first pixel defining portion PD1 and the second pixel defining portion PD2 may contain an organic material.

Each of the first pixel defining portion PD1 and the second pixel defining portion PD2 may contain a hydrophobic organic material. The first pixel defining portion PD1 and the second pixel defining portion PD2 may contain the same material as each other and formed at the same time.

The third pixel defining portion PD3 may contain an inorganic material. For example, the third pixel defining portion PD3 may contain at least one of a silicon nitride ($SiN_x$), a silicon oxide ($SiO_x$), and a silicon oxynitride ($SiO_xN_y$). Preferably, the third pixel defining portion PD3 may contain the silicon nitride ($SiN_x$).

A first electrode AE may be disposed on the third insulation layer 30. The first electrode AE may be connected to an output electrode SE through a third through-hole CH3 passing through the third insulation layer 30. In FIG. 3B, although the first electrode AE is exemplarily disposed on the third insulation layer 30, the embodiment of the inventive concept is not limited thereto. For example, the first electrode AE may be embedded in the third insulation layer 30 while a top surface thereof is exposed. In this case, the top surface of the first electrode AE and a top surface of the third insulation layer 30 may provide the same plane.

The opening OP of the pixel defining layer PDL exposes at least a portion of the first electrode AE. In a plan view, the third pixel defining portion PD3 may overlap at least a portion of the first electrode AE. In particular, the third pixel defining portion PD3 may overlap an outer portion of the first electrode AE in a plan view to surround the first pixel electrode AE.

An intermediate layer EML may be disposed on the first electrode AE. The intermediate layer EML may be disposed in the opening OP of the pixel defining layer PDL. The intermediate layer EML may include a light emitting layer and produce blue light. Here, the blue light may have a wavelength of about 410 nm to about 480 nm. The light emitting layer of the intermediate layer EML may have a tandem structure or a single layer structure.

The intermediate layer EML may include a low molecular organic material or high molecular organic material. Alternatively, the intermediate layer EML may contain a quantum dot as a light emitting material. A core of the quantum dot may be selected from the group consisting of Group II-VI compound, Group III-V compound, Group IV-VI compound, Group IV element, Group IV compound, and a combination thereof.

In FIG. 3B, although the intermediate layer EML is exemplarily patterned and disposed on the opening OP and the second pixel defining portion PD2 of the pixel defining layer PDL and is not disposed on the first pixel defining portion PD1, the embodiment of the inventive concept is not limited thereto. For example, the intermediate layer EML may be disposed over the first to third pixel areas PXA-1, PXA-2, and PXA-3 (refer to FIG. 3A).

The intermediate layer EML may include functional layers such as a hole transporting layer, a hole injection layer, an electron transporting layer, and an electron injection layer in addition to the light emitting layer. As described above, each of the functional layers may be patterned and disposed on the opening OP and the second pixel defining portion PD2 of the pixel defining layer PDL and disposed in common over the first to third pixel areas PXA-1, PXA-2, and PXA-3.

The intermediate layer EML may contact a portion of the first pixel defining portion PD1, which is exposed by the spaced portion PD3-SP of the third pixel defining portion PD3. In particular, the one side surface PD1-LF of the first pixel defining portion PD1 may be exposed by the spaced portion PD3-SP of the third pixel defining portion PD3, and the intermediate layer EML may contact the one side surface PD1-LF. The intermediate layer EML may contact only a portion of the one side surface PD1-LF of the first pixel defining portion PD1 and may not contact the rest portion of the first pixel defining portion PD1.

A second electrode CE is disposed on the intermediate layer EML. The second electrode CE may be disposed in common over the first to third pixel areas PXA-1, PXA-2, and PXA-3 (refer to FIG. 3A). The second electrode CE may have an area greater than that of the first electrode AE.

A cover layer CL, which protects the second electrode CE and the light emitting element LED, may be further disposed on the second electrode CE. The cover layer CL may contain an organic material or an inorganic material. The cover layer CL may have a structure in which an organic material layer and an inorganic material layer are alternately laminated with each other. In an embodiment, the cover layer CL may be omitted.

The display panel according to an embodiment of the inventive concept includes a pixel defining portion which includes a hydrophobic organic material and an inorganic material covering the hydrophobic organic material. Although the hydrophobicity of the hydrophobic organic material may be degraded in a residue treatment process including a plasma process, the display panel according to an embodiment of the inventive concept may prevent degradation of the hydrophobicity of the hydrophobic organic material caused by the plasma process through the inorganic material pixel defining portion covering the pixel defining portion having the hydrophobic organic material. Also, because the inorganic material pixel defining portion has a spaced portion which exposes a hydrophobic surface of the first pixel defining portion PD1 through the spaced portion, when an organic light emitting layer is provided through a printing method such as inkjet printing, the organic light emitting layer may contact the hydrophobic surface, and thus an overflow phenomenon of the organic light emitting layer may be prevented.

Figure 4A:
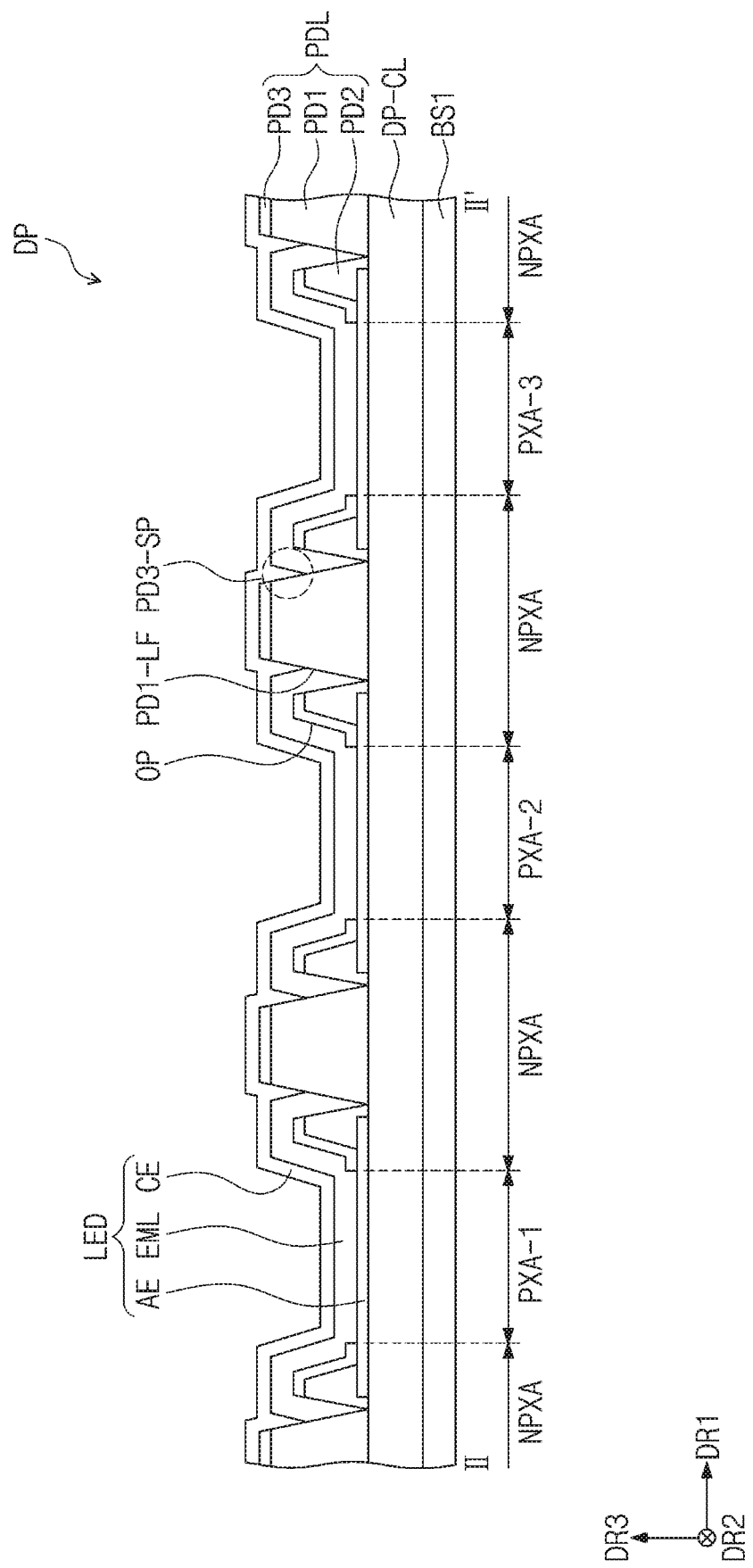
FIGS. 4A, 4B and 4C are cross-sectional views illustrating a pixel area of a display panel according to an embodiment of the inventive concept.
Figure 4B:
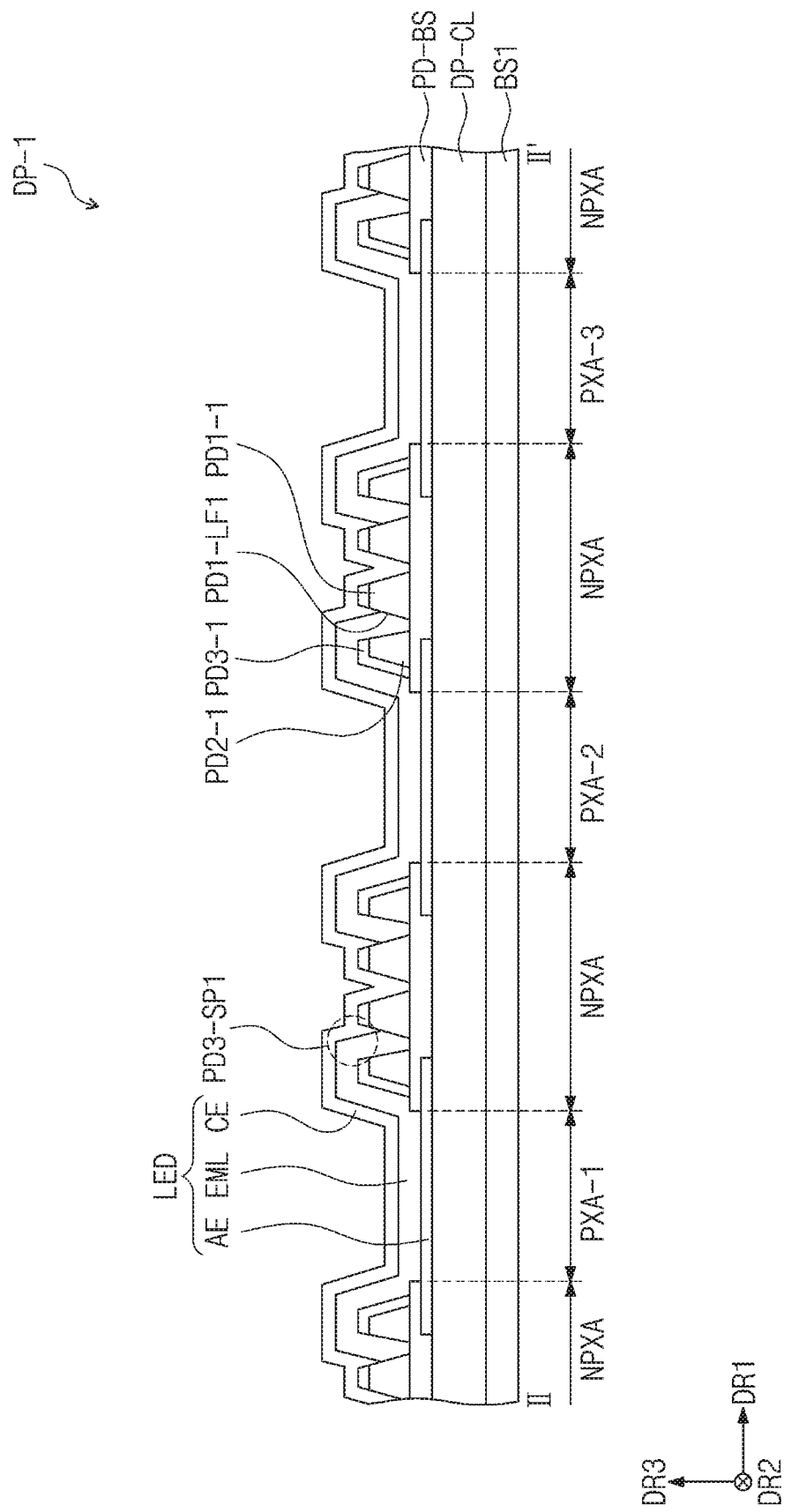
Figure 4C:
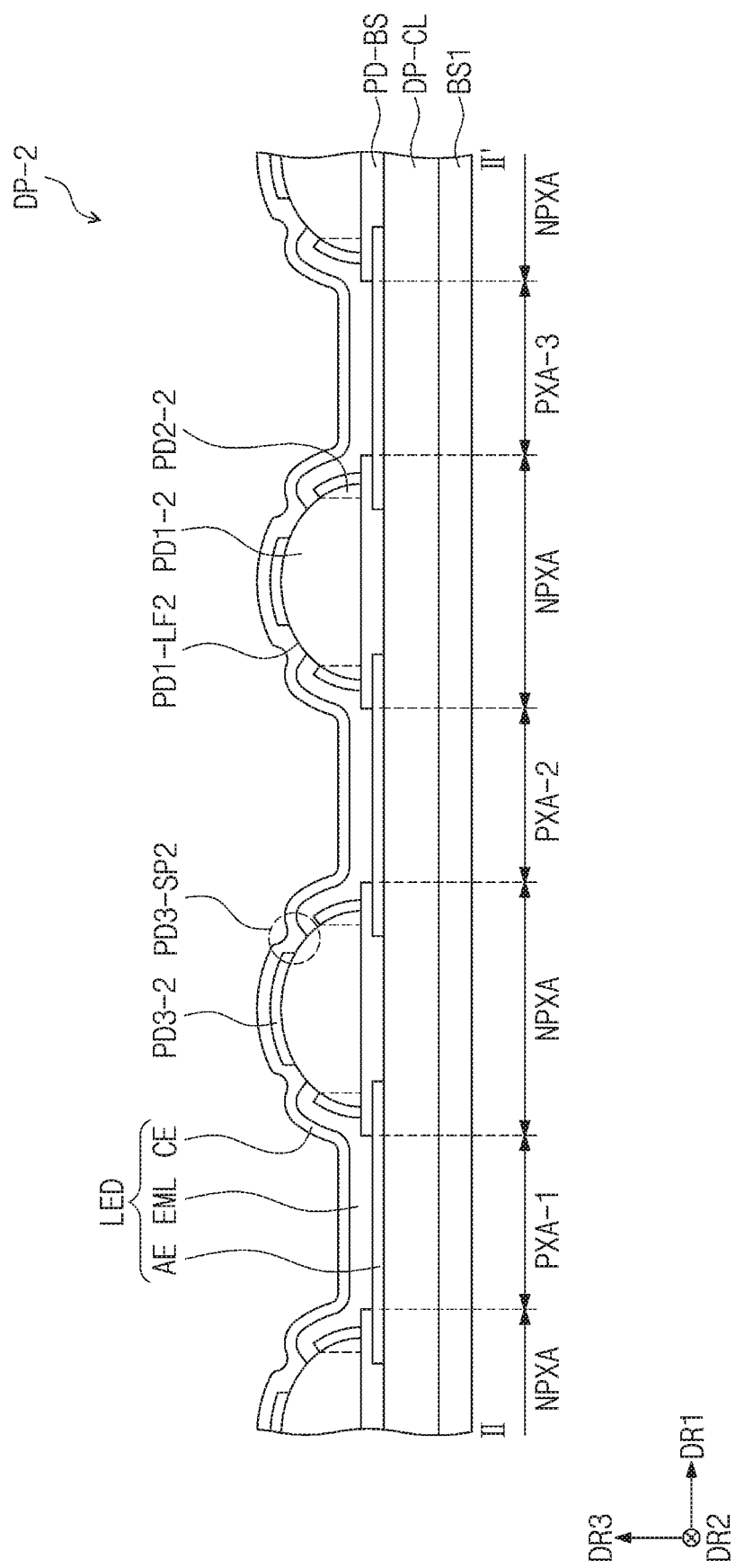

FIGS. 4A to 4C are cross-sectional views illustrating pixel areas PXA-1, PXA-2, and PXA-3 of display panels according to an embodiment of the inventive concept. FIGS. 4A to 4C are cross-sectional views taken along line II-IT of FIG. 3A. Hereinafter, in describing FIGS. 4A to 4C, the same components described in FIGS. 3A and 3B will be designated by the same reference symbols, and description regarding this will be omitted.

Referring to FIG. 4A, openings OP overlapping the first to third pixel areas PXA-1, PXA-2, and PXA-3, respectively, may be defined in the pixel defining layer PDL. In FIG. 4A, because the first to third pixel areas PXA-1, PXA-2, and PXA-3 have the same planar area as each other, the openings OP defining the first to third pixel areas PXA-1, PXA-2, and PXA-3 have the same area as each other. However, the embodiment of the inventive concept is not limited thereto. For example, a size of each of the openings OP may be varied according to an area of each of the first to third pixel areas PXA-1, PXA-2, and PXA-3.

In the pixel defining layer PDL, a first pixel defining portion PD1 may be disposed on a central portion of each of the surrounding areas NPXA, and a second pixel defining portion PD2 may be disposed adjacent to each of the first to third pixel areas PXA-1, PXA-2, and PXA-3 to surround the first to third pixel areas PXA-1, PXA-2, and PXA-3. A third pixel defining portion PD3 may be disposed on the first pixel defining portion PD1 and the second pixel defining portion PD2 to cover the first pixel defining portion PD1 and the second pixel defining portion PD2, and a plurality of spaced portions PD3-SP may be defined to exposed each of boundaries of the first pixel defining portion PD1 and the second pixel defining portion PD2. The spaced portion PD3-SP may expose one side surface PD1-LF of each of the first pixel defining portions PD1 in a cross-sectional view.

As illustrated in FIG. 4A, intermediate layers EML may be patterned to overlap the first to third pixel areas PXA-1, PXA-2, and PXA-3, respectively. Each of the patterned intermediate layers EML may include a light emitting layer and be disposed in the opening OP and on the second pixel defining portion PD2 of the pixel defining layer PDL. Each of the intermediate layers EML may be disposed to contact the one side surface PD1-LF of each of the first pixel defining portion PD1.

Referring to FIG. 4B, in a display panel DP-1 according to an embodiment of the inventive concept, a first pixel defining portion PD1-1 may include a plurality of sub-patterns. The plurality of sub-patterns may be spaced apart from each other in the first direction DR1 in a cross-sectional view. Although the first pixel defining portion PD1-1 includes two sub-patterns in FIG. 4B, the embodiment of the inventive concept is not limited thereto. For example, the first pixel defining portion PD1-1 may include three or more sub-patterns.

Each of the sub-patterns of the first pixel defining portion PD1-1 may include one side surface PD1-LF1 adjacent to the second pixel defining portion PD2-1, and the one side surface PD1-LF1 of each of the sub-patterns of the first pixel defining portion PD1-1 may be exposed by the spaced portion PD3-SP1 of the third pixel defining portion PD3-1. The intermediate layer EML including a light emitting layer may contact the one side surface PD1-LF1 of each of the sub-patterns of the first pixel defining portion PD1-1. The intermediate layer EML may contact only a portion of the one side surface PD1-LF1 of the first pixel defining portion PD1-1 and may not contact the rest portion of the first pixel defining portion PD1-1.

The display panel DP-1 according to an embodiment of the inventive concept may further include a base pixel defining layer PD-BS. The base pixel defining layer PD-BS may overlap an outer portion of the first electrode AE in a plan view. The base pixel defining layer PD-BS may include a hydrophobic organic material. The sub-patterns of the first pixel defining portion PD1-1, the second pixel defining portion PD2-1, and the third pixel defining portion PD3-1 may be disposed on the base pixel defining layer PD-BS.

Referring to FIG. 4C, in a display panel DP-2 according to an embodiment of the inventive concept, a first pixel defining portion PD1-2 and a second pixel defining portion PD2-2 may be formed in one piece, formed of the same material and formed through the same process. The first pixel defining portion PD1-2 and the second pixel defining portion PD2-2 may be integrated with each other to have a dome shape. A third pixel defining portion PD3-2 may cover edge of an upper portion of the integrated dome shape and expose a center portion of the dome shape. Here, a portion including an exposed portion in the integrated dome shape may be defined as the first pixel defining portion PD1-2, and a portion adjacent to each of the pixel areas PXA-1, PXA-2, and PXA-3 without including the exposed portion may be defined as the second pixel defining portion PD2-2.

A portion of the first pixel defining portion PD1-2 may be exposed by the spaced portion PD3-SP2 of the third pixel defining portion PD3-2. The intermediate layer EML including a light emitting layer may contact the exposed one side surface PD1-LF2 of the first pixel defining portion PD1-2.

The intermediate layer EML may contact only a portion of the one side surface PD1-LF2 of the first pixel defining portion PD1 and may not contact the rest portion of the first pixel defining portion PD1.

Figure 5:
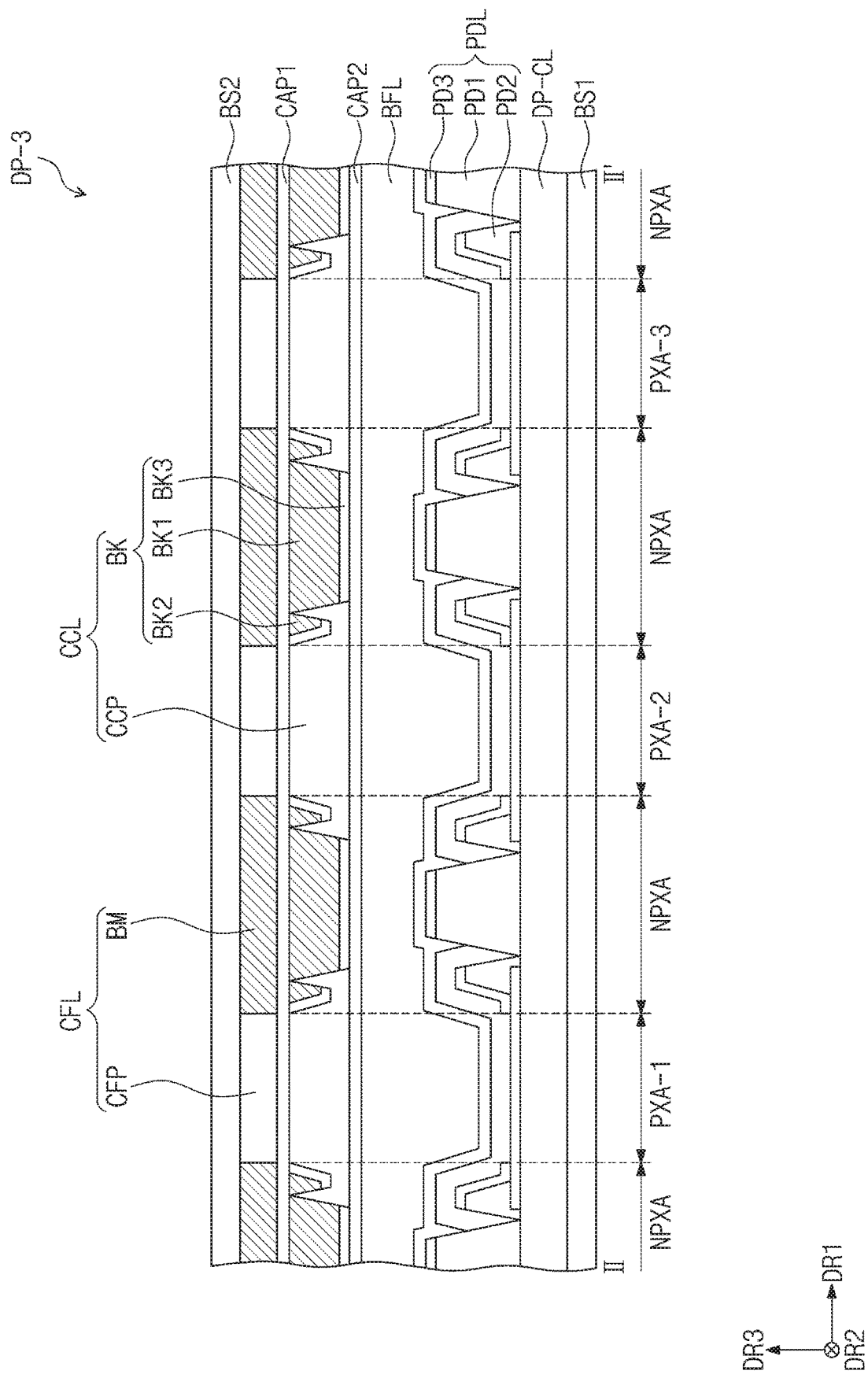
FIG. 5 is a cross-sectional view illustrating a pixel area of a display panel according to an embodiment of the inventive concept.

FIG. 5 is a cross-sectional view illustrating pixel areas PXA-1, PXA-2, and PXA-3 of a display panel according to an embodiment of the inventive concept. FIG. 5 illustrates a cross-section taken along line II-IF of FIG. 3A. Hereinafter, in describing FIG. 5, the above-described components will be designated by the same reference symbols, and description regarding this will be omitted.

Referring to FIG. 5, a display panel DP-3 according to an embodiment of the inventive concept may further include a light control layer CCL disposed on a light emitting element. The display panel DP-3 according to an embodiment may further include a color filter layer CFL disposed on the light control layer CCL and an upper base substrate BS2. The display panel DP-3 according to an embodiment may further include capping layers CAP1 and CAP2 covering upper and lower portions of the light control layer CCL and a filling layer BFL that fills a space between the light control layer CCL and the light emitting element. The color filter layer CFL contained in the display panel DP-3 according to an embodiment may include a light shielding member BM overlapping a surrounding area NPXA and a color filter part CFP overlapping pixel areas PXA-1, PXA-2, and PXA-3.

In the display panel DP-3 according to an embodiment of the inventive concept, the light control layer CCL may include a light control part CCP and a bank part BK. The light control part CCP may include a light emitting material, scattering particles, a base resin, and the like. The light emitting material contained in the light control part CCP may convert a wavelength of light emitted from the light emitting element. In an embodiment, the light control part CCP may include a quantum dot as the light emitting material.

In the display panel DP-3 according to an embodiment of the inventive concept, the bank part BK may include a first bank part BK1, a second bank part BK2, and a third bank part BK3. The first bank part BK1 may be disposed at a central portion of each of the surrounding areas NPXA, and the second bank part BK2 may be disposed adjacent to each of the first to third pixel areas PXA-1, PXA-2, and PXA-3 on each of the surrounding areas NPXA. The third bank part BK3 may be disposed on the first bank part BK1 and the second bank part BK2 to cover the first bank part BK1 and the second bank part BK2, and a plurality of spaced portions may be defined to expose each of boundary portions between the first bank part BK1 and the second bank part BK2. Each of the spaced portions may expose one side surface of each of the first bank parts BK1.

Each of the first bank part BK1 and the second bank part BK2 may include an organic material. Each of the first bank part BK1 and the second bank part BK2 may include a hydrophobic organic material. The third bank part BK3 may include an inorganic material. For example, the third bank part BK3 may contain at least one of a silicon nitride ($SiN_x$), a silicon oxide ($SiO_x$), and a silicon oxynitride ($SiO_xN_y$). Preferably, the third bank part BK3 may contain the silicon nitride ($SiN_x$).

In the display panel DP-3 according to an embodiment of the inventive concept, the light control layer CCL includes a bank part having a hydrophobic organic material and a bank part having an inorganic material covering the bank part having the hydrophobic organic material. Although hydrophobicity of the bank part having the hydrophobic organic material may be degraded during a residue treatment process including a plasma process, the display panel according to an embodiment of the inventive concept may prevent a degradation of the hydrophobicity of the bank part having the hydrophobic organic material due to the plasma process through the bank part having the inorganic that covers the bank part having the hydrophobic organic material. Also, because a spaced portion is defined in the bank part having the inorganic material which exposes the hydrophobic surface, when the light control part, in which the light emitting material such as a quantum dot is distributed in the base resin, is provided through a printing method such as an inkjet, the light control part may contact the hydrophobic surface, and thus an overflow phenomenon of the light control part may be prevented.

Hereinafter, a manufacturing method of a display panel according to an embodiment of the inventive concept will be described.

Figure 8B:
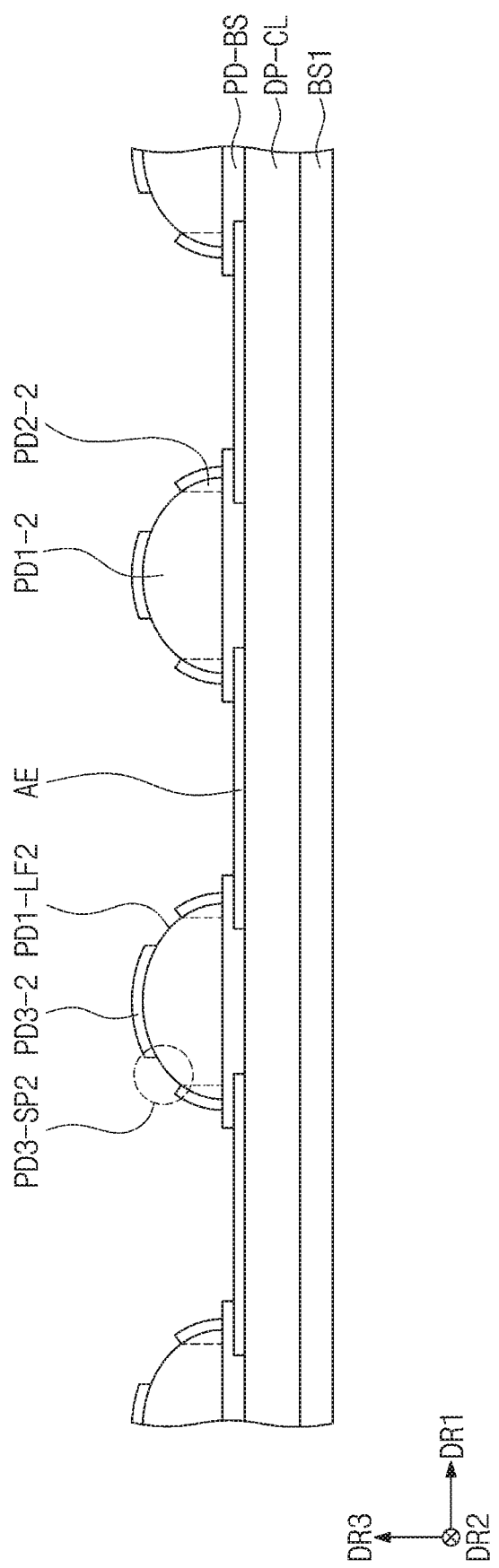

FIGS. 6A to 6G are cross-sectional views sequentially illustrating partial processes of a manufacturing method of a display panel according to one embodiment of the inventive concept. FIGS. 7A and 7B are cross-sectional views sequentially illustrating partial processes of a manufacturing method of a display panel according to another embodiment of the inventive concept. FIGS. 8A and 8B are cross-sectional views sequentially illustrating partial processes of a manufacturing method of a display panel according to the other embodiment of the inventive concept. In FIGS. 6A to 6G, in the manufacturing method of the display panel according to one embodiment, a process of forming a pixel defining layer and a process of forming a light emitting element are sequentially illustrated. In FIGS. 7A, 7B, 8A, and 8B, in the manufacturing method of the display panel according to other embodiments, partial processes of a process of forming a pixel defining layer are sequentially illustrated.

Referring to FIG. 6A, in the manufacturing method of the display panel according to an embodiment, a first electrode AE and a first pixel defining portion PD1 may be formed on a base substrate BS1 and a circuit element layer DP-CL. Each of the first electrode AE and the first pixel defining portion PD1 may be formed in plurality on the circuit element layer DP-CL, and each of a plurality of first electrodes AE and a plurality of first pixel defining portions PD1 may be spaced apart from each other in the first direction DR1 on a cross-section. The plurality of first electrodes AE and the plurality of first pixel defining portions PD1 may be alternately arranged in the first direction DR1 on the cross-section.

The circuit element layer DP-CL includes at least one insulation layer and a circuit element. The third insulation layer 30 (refer to FIG. 3B) containing an organic material may be disposed on an uppermost portion of the circuit element layer DP-CL.

The first pixel defining portion PD1 may contain a hydrophobic organic material. The first pixel defining portion PD1 may be made of the organic material to have liquid repellency on a surface thereof. Although not separately shown, an additional process of liquid repellency treatment on the surface of the first pixel defining portion PD1 may be performed.

The first pixel defining portion PD1 may be formed by patterning a hydrophobic organic material on the circuit element layer DP-CL and curing the patterned hydrophobic organic material. The first pixel defining portion PD1 may be in a state in which the hydrophobic organic pattern formation and curing process is completed before a following inorganic layer formation process. However, the embodiment of the inventive concept is not limited thereto. For example, the first pixel defining portion PD1 may be in a hydrophobic organic material pattern state before the inorganic layer formation process and then formed through the curing process after the inorganic layer formation process.

Referring to FIG. 6B, the organic material on the circuit element layer DP-CL is patterned to form a plurality of organic patterns PP. Each of the plurality of organic patterns PP may contain a hydrophobic organic material. Each of the plurality of organic patterns PP may be formed by patterning the hydrophobic organic material.

Each of the plurality of organic patterns PP may be formed by patterning the hydrophobic organic material so as to be disposed adjacent to each of the first pixel defining portions PD1. Each of the plurality of hydrophobic organic patterns PP may be disposed spaced apart from the first pixel defining portion PD1 and overlap an outer portion of the first electrode AE in a plan view. However, the first pixel defining portion PD1 and the plurality of organic patterns PP may be formed of a same material and formed through a same process. The first pixel defining portion PD1 and the plurality of organic patterns PP may be formed at the same time using one mask through the same process.

Referring to FIG. 6C, an inorganic layer IOL-P1 is formed on the plurality of organic patterns PP and the first pixel defining portion PD1. The inorganic layer IOL-P1 may be formed to cover the plurality of organic patterns PP, the first pixel defining portion PD1, and the first electrode AE.

The inorganic layer IOL-P1 may contain an inorganic material. The inorganic layer IOL-P1 may contain at least one of a silicon nitride ($SiN_x$), a silicon oxide ($SiO_x$), and a silicon oxynitride ($SiO_xN_y$). Preferably, the inorganic layer IOL-P1 may contain the silicon nitride ($SiN_x$). The inorganic layer IOL-P1 may be formed by depositing an inorganic material such as a silicon nitride ($SiN_x$), a silicon oxide ($SiO_x$), and a silicon oxynitride ($SiO_xN_y$) through a deposition process.

Referring to FIG. 6D in conjunction with FIG. 6C, an inorganic layer pattern IOL-P2 may be formed by patterning the inorganic layer IOL-P1. In an embodiment, a portion of the inorganic layer IOL-P1, which is disposed on a central portion of the first electrode AE, may be removed, for example, by using an etch process. The inorganic layer pattern IOL-P2 may be formed by patterning the inorganic layer IOL-P1 through a photolithography method.

Referring to FIG. 6E, the manufacturing method of the display panel according to an embodiment includes a process of removing a residue after the inorganic layer pattern IOL-P2 is formed. The residue may be generated in the process of forming the first pixel defining portion PD1, the process of forming the plurality of organic patterns PP, and the process of forming and patterning the inorganic layer IOL-P1.

The process of removing the reside may include a plasma PT treatment process. Through the plasma PT treatment process, the residue existing on the inorganic layer pattern IOL-P2 and the first electrode AE may be effectively removed.

In the manufacturing method of the display panel according to an embodiment, before the organic light emitting layer is formed, the residue formed on the inorganic layer pattern and the first electrode, on which the organic light emitting layer will be formed, is effectively removed through the plasma treatment process to improve an efficiency of the display panel. More particularly, when a residue exists at a position at which the organic light emitting layer is formed, because the organic light emitting layer is not uniformly formed, light emitting characteristics of the display panel may be degraded. However, in the manufacturing method of the display panel according to an embodiment, as the residue is removed through the plasma treatment before the organic light emitting layer is formed, the organic light emitting layer may be uniformly formed, thus the degradation of the light emitting characteristics may be prevented.

Also, in the manufacturing method of the display panel according to an embodiment, because the inorganic pattern covers the hydrophobic organic pixel defining layer or the hydrophobic organic pattern during the plasma treatment process, the degradation of the hydrophobicity of the organic pixel defining layer may be prevented. Thus, in a following organic light emitting layer formation process, an overflow phenomenon in which the organic light emitting layer overflows may be prevented.

Referring to FIG. 6F in conjunction with FIG. 6E, in the manufacturing method of the display panel according to an embodiment, the first pixel defining portion PD1 and a second pixel defining portion PD2 may be formed by curing the first pixel defining portion PD1 and the organic patterns PP after the residue removing process.

In a process of curing, the organic patterns PP may contract more than the first pixel defining portion PD1 during the curing process. Thus, the second pixel defining portion PD2 may be smaller in size than each of the organic patterns PP before being cured. The second pixel defining portion PD2 may be smaller in height than the first pixel defining portion PD1 because the organic patterns PP may contract more during the curing process than the first pixel defining portion PD1.

In the process of curing the organic patterns PP and the first pixel defining portion PD1, a spaced portion PD3-SP is formed in the inorganic layer pattern IOL-P2 disposed between the organic patterns PP and the first pixel defining portion PD1. The spaced portion PD3-SP may be formed at a boundary between the first pixel defining portion PD1 and the second pixel defining portion PD2 and expose at least one side surface PD1-LF of the first pixel defining portion PD1. The one side surface PD1-LF of the first pixel defining portion PD1 may be disposed adjacent to the second pixel defining portion PD2.

A spaced portion PD3-SP formed in the third pixel defining portion PD3 may be formed due to a stress, which is generated in the inorganic layer pattern IOL-P2 as the organic patterns PP is contracted into a size of the second pixel defining portion PD2 during the curing process, and a crack, which is generated in the inorganic layer pattern IOL-P2 by an out gas generated from the third insulation layer 30 (refer to FIG. 3B) disposed on an upper portion of the circuit element layer DP-CL during the curing process. Here, as the stress generated while the organic patterns PP are contracted and the external pressure generated by the out gas of the insulation layer are concentrated on a vulnerable portion of the inorganic layer pattern IOL-P2, the spaced portion PD3-SP may be formed at the boundary between the first pixel defining portion PD1 and the second pixel defining portion PD2.

Referring to FIG. 6G, in the manufacturing method of the display panel according to an embodiment, an intermediate layer EML including a light emitting layer and a second electrode CE may be formed on each of the first to third pixel defining portions PD1, PD2, and PD3.

The intermediate layer EML may be formed in a solution process. In an embodiment, a light emitting layer, a hole injection layer, and a hole transporting layer, which constitutes the intermediate layer EML, may be formed through a low molecular organic material or a high molecular organic material. The intermediate layer EML may be formed through a photolithography process by forming and patterning the intermediate forming material on an area defined by each of one side surfaces PD1-LF of the first pixel defining portions PD1. When the intermediate layer EML is formed by the solution process, as the hydrophobic one side surface PD1-LF of the first pixel defining portion PD1 is exposed, the intermediate layer EML may be uniformly formed without being overflowed.

FIGS. 7A and 7B are views illustrating a process of forming an inorganic pattern and curing organic patterns in a manufacturing method of a display panel according to another embodiment of the inventive concept. Hereinafter, in describing FIGS. 7A and 7B, the same components as those described previously in FIGS. 6A to 6G will be designated by the same reference symbols, and description regarding this will be omitted.

Referring to FIG. 7A, in the manufacturing method of the display panel according to another embodiment of the inventive concept, a plurality of first organic patterns PP-1 and a plurality of second organic patterns PP-2 which are spaced apart from one another may be formed on a circuit element layer DP-CL at the same time. Each of the first organic patterns PP-1 and the second organic patterns PP-2 may be formed of a hydrophobic organic material through a photolithography method. The first organic patterns PP-1 may include a plurality of sub-patterns that are spaced apart from each other in the first direction. In FIG. 7A, although each of the first organic patterns PP-1 exemplarily includes two sub-patterns, the embodiment of the inventive concept is not limited thereto. For example, each of the first organic patterns PP-1 may include three or more sub-patterns.

An inorganic layer pattern IOL-P3 may be formed on the first organic patterns PP-1 and the second organic patterns PP-2. The inorganic layer pattern IOL-P3 may be formed such that an inorganic layer is formed by depositing an inorganic material on the first organic patterns PP-1 and the second organic patterns PP-2, and then an area overlapping a central portion of the first electrode AE on a plane is etched.

The manufacturing method of the display panel according to an embodiment of the inventive concept may further include a process of forming a base pixel defining layer PD-BS on the circuit element layer DP-CL before the process of forming the first organic patterns PP-1 and the second organic patterns PP-2. The base pixel defining layer PD-BS may overlap an outer portion of the first electrode AE on the plane. The base pixel defining layer PD-BS may be formed such that the hydrophobic organic material is patterned through a photolithography method and then cured. The first organic patterns PP-1, the second organic patterns PP-2, and the inorganic layer pattern IOL-P3 may be formed on the base pixel defining layer PD-BS.

After the first organic patterns PP-1, the second organic patterns PP-2, and the inorganic layer pattern IOL-P3 are formed, a process of plasma treatment on a surface of the inorganic layer pattern IOL-P3 in order to remove a residue generated during the formation process may be performed. In the plasma treatment process, because the first organic patterns PP-1 and the second organic patterns PP-2, each of which contains a hydrophobic material, are covered by the inorganic layer pattern IOL-P3, degradation in hydrophobicity caused by the plasma may not be occurred.

Referring to FIG. 7B in conjunction with FIG. 7A, a first pixel defining portion PD1-1 and a second pixel defining portion PD2-1 may be formed by curing the first organic patterns PP-1 and the second organic patterns PP-2, respectively. The first pixel defining portion PD1-1 may include a plurality of sub-patterns.

In the curing process, each of the first organic patterns PP-1 and the second organic patterns PP-2 may be contracted to form the first pixel defining portion PD1-1 and the second pixel defining portion PD2-1. Because a crack is generated at a vulnerable portion of the inorganic layer pattern IOL-P3 covering the first organic patterns PP-1 and the second organic patterns PP-2 due to a stress generated when the first organic patterns PP-1 and the second organic patterns PP-2 are contracted, a spaced portion PD3-SP1 may be formed in the third pixel defining portion PD3-1. One side surface PD1-LF1 of the first pixel defining portion PD1-1 may be exposed by the spaced portion PD3-SP1 of the third pixel defining portion PD3-1.

FIGS. 8A and 8B are views a process of forming an inorganic layer pattern and a process of curing organic patterns in a manufacturing method of a display panel according to another embodiment of the inventive concept. Hereinafter, in describing FIGS. 8A to 8B, the same components described in FIGS. 6A and 6G will be designated by the same reference symbols, and description regarding this will be omitted.

Referring to FIG. 8A, in the manufacturing method of a display panel according to another embodiment of the inventive concept, a plurality of organic patterns PP-3 may be formed on a circuit element layer DP-CL. The plurality of organic patterns PP-3 may be formed to have a dome shape on a base pixel defining layer PD-BS. An inorganic layer pattern IOL-P4 may be formed on the plurality of organic patterns PP-3 to entirely cover the dome shape. The inorganic layer pattern IOL-P4 may be formed such that an inorganic layer is formed by depositing an inorganic material to entirely overlap a base substrate BS1, and then an area overlapping a central portion of a first electrode AE is removed, for example, by using an etch process.

After the process of forming the plurality of organic patterns PP-3 and the inorganic layer pattern IOL-P4, a process of performing plasma treatment on a surface of the inorganic layer pattern IOL-P4 in order to remove a residue generated during the formation process may be performed. In the plasma treatment process, because the plurality of organic patterns PP-3, which contain a hydrophobic material, are covered by the inorganic layer pattern IOL-P4, degradation of hydrophobicity caused by the plasma may not be occurred.

Referring to FIG. 8B in conjunction with FIG. 8A, a first pixel defining portion PD1-2 and a second pixel defining portion PD2-2 may be formed by curing the plurality of organic patterns PP-3. In the curing process, a spaced portion PD3-SP2 may be formed in an inorganic layer pattern IOL-P4 to form a third pixel defining portion PD3-2.

In the curing process, the plurality of organic patterns PP-3 may be contracted to form a first pixel defining portion PD1-2 and a second pixel defining portion PD2-2. Because a crack is generated in the inorganic layer pattern IOL-P4 covering the plurality of organic patterns PP-3 by a stress generated when the organic patterns PP-3 are contracted, a third pixel defining portion PD3-2 having a spaced portion PD3-SP2 may be formed. In FIG. 8B, although two spaced portions PD3-SP2 are regularly formed in each of the third pixel defining portions PD3-2 as an example, the embodiment of the inventive concept is not limited thereto. For example, a planar position at which the spaced portion PD3-SP2 is formed and a planar area of the spaced portion PD3-SP2 may be randomly formed. One side surface PD1-LF2 of the first pixel defining portion PD1-2 may be exposed by the spaced portion PD3-SP2 of the third pixel defining portion PD3-2.

According to the embodiment of the inventive concept, as the organic pixel defining layer is protected by the inorganic layer during the residue treatment process, and the hydrophobic surface of the organic pixel defining layer is exposed in the curing process following the residue treatment process, the uniform organic light emitting layer may be formed. Thus, the light emitting efficiency and reliability of the display panel may increase.

Although the exemplary embodiments of the present inventive concept have been described, it is understood that the present inventive concept should not be limited to these exemplary embodiments but various changes and modifications can be made by one ordinary skilled in the art within the spirit and scope of the present inventive concept as hereinafter claimed.

Hence, the real protective scope of the present inventive concept shall be determined by the technical scope of the accompanying claims.

What is claimed is:

1. A display panel comprising:
a base substrate on which a pixel area and a surrounding area adjacent to the pixel area are defined;
a pixel defining layer which is disposed on the base substrate and on which a plurality of openings corresponding to the pixel area are defined; and
a plurality of light emitting layers disposed in the plurality of openings, respectively,
wherein the pixel defining layer comprises:
a first pixel defining portion,
a second pixel defining portion disposed between the light emitting layers and the first pixel defining portion, and
a third pixel defining portion covering the first pixel defining portion and the second pixel defining portion and including a spaced portion exposing a portion of the first pixel defining portion.

2. The display panel of claim 1, wherein the first pixel defining portion comprises one side surface adjacent to the second pixel defining portion, and
the one side surface is exposed by the spaced portion of the third pixel defining portion.

3. The display panel of claim 1, wherein the first pixel defining portion comprises a hydrophobic material.

4. The display panel of claim 1, wherein the light emitting layer contacts the exposed portion of the first pixel defining portion.

5. The display panel of claim 4, wherein the third pixel defining portion overlaps at least a portion of the light emitting layer in a plan view.

6. The display panel of claim 1, wherein the third pixel defining portion comprises at least one of a silicon nitride ($SiN_x$), a silicon oxide ($SiO_x$), or a silicon oxynitride ($SiO_xN_y$).

7. The display panel of claim 1, further comprising a base pixel defining layer that overlaps the surrounding area of the base substrate, and
wherein the pixel defining layer is disposed on the base pixel defining layer.

8. The display panel of claim 1, wherein the first pixel defining portion has a height equal to or greater than that of the second pixel defining portion.

9. The display panel of claim 1, wherein the first pixel defining portion and the second pixel defining portion are spaced apart from each other.

10. The display panel of claim 9, wherein the first pixel defining portion comprises a plurality of sub-patterns that are spaced apart from each other in a first direction.

11. A manufacturing method of a display panel, comprising:
forming a plurality of electrodes on a base substrate:
forming a plurality of organic patterns by patterning an organic material on the base substrate on the plurality of electrodes;
forming an inorganic layer to cover the plurality of organic patterns;
patterning the inorganic layer to expose the plurality of electrodes;
removing a residue on the plurality of electrodes; and
curing the plurality of organic patterns to form a pixel defining layer.

12. The manufacturing method of claim 11, wherein, in the patterning the inorganic layer, a spaced portion is formed in the inorganic layer.

13. The manufacturing method of claim 12, wherein at least a portion of each of the plurality of cured organic patterns is exposed by the spaced portion.

14. The manufacturing method of claim 13, wherein a plurality of openings are defined in the pixel defining layer to expose the plurality of electrodes,
the manufacturing method further comprises forming an intermediate layer comprising a light emitting material in each of the plurality of openings after the forming of the pixel defining layer, and
the intermediate layer contacts the exposed portion of each of the plurality of cured organic patterns.

15. The manufacturing method of claim 11, wherein the pixel defining layer comprises a first pixel defining portion, a second pixel defining portion spaced apart from the first pixel defining portion, and a third pixel defining portion covering the first pixel defining portion and the second pixel defining portion and in which a spaced portion exposing a portion of the first pixel defining portion is defined,
the first pixel defining portion is formed by curing first organic patterns formed on the base substrate before the forming of the inorganic layer, and
the second pixel defining portion is formed by curing second organic patterns formed adjacent to the first pixel defining portion on the base substrate after the forming of the inorganic layer.

16. The manufacturing method of claim 15, wherein, before the curing of the second organic patterns,
the third pixel defining portion is formed by forming the spaced portion in the inorganic layer, and
the spaced portion is formed at a boundary between the first pixel defining portion and the second pixel defining portion.

17. The manufacturing method of claim 11, wherein in the forming of the pixel defining layer, the plurality of organic patterns are contracted by the curing process.

18. The manufacturing method of claim 11, wherein the plurality of organic patterns comprise a hydrophobic material.

19. The manufacturing method of claim 11, wherein the removing of the residue comprises performing plasma treatment on a surface of the inorganic layer.

20. The manufacturing method of claim 11, further comprising forming a base pixel defining layer on the base substrate before the forming of the plurality of organic patterns,
wherein the pixel defining layer is formed on the base pixel defining layer.

* * * * *